United States Patent [19]
Wellstood et al.

[11] Patent Number: 5,291,035
[45] Date of Patent: Mar. 1, 1994

[54] MICROELECTRONIC SUPERCONDUCTING CROSSOVER AND COIL

[75] Inventors: Frederick C. Wellstood, Berkeley; John J. Kingston, Oakland; John Clarke, Berkeley, all of Calif.

[73] Assignee: The Regents of the University of California, Oakland, Calif.

[21] Appl. No.: 33,059

[22] Filed: Mar. 10, 1993

Related U.S. Application Data

[63] Continuation of Ser. No. 543,462, Jun. 25, 1990, abandoned, which is a continuation-in-part of Ser. No. 491,703, Mar. 12, 1990, abandoned, which is a continuation-in-part of Ser. No. 491,228, Mar. 9, 1990, abandoned.

[51] Int. Cl.$^5$ .................. H01L 39/22; H01L 49/02
[52] U.S. Cl. ........................... 257/33; 257/32; 257/35; 257/661; 505/1
[58] Field of Search .............. 357/5; 505/1; 257/30, 257/31, 32, 33, 35, 37, 661, 663

[56] References Cited

U.S. PATENT DOCUMENTS 5,019,551  5/1991  Hidaka ................................. 505/1

FOREIGN PATENT DOCUMENTS 57-30390  2/1982  Japan .
2-186682  7/1990  Japan .

OTHER PUBLICATIONS

Rothschild et al "Laser Patterning of Metal Oxide Superconductor Films by Reactive Solid-State Transformation" *IEEE Elect. Dev. Lett.* vol. 9(2) (Feb. 1988) pp. 68-70.
Witanachchi et al "Deposition of Superconducting Y-Ba-Cu-O films at 400° C. without post annealing" *Appl. Phys. Lett.* vol. 53(3) (Jul. 18, 1988) pp. 234-235.
Klepner, "Process Test Chip for Josephson Integrated Circuits", IEEE Transactions on Magnetics, vol. MAG-17, No. 1, Jan., 1981, pp. 282 et seq.
Kaplunenko, et al., "Experimental Study of the RSFQ Logic Elements", IEEE Transactions on Magnetics, vol. 25, No. 2, Mar. 1989, pp. 861 et seq.
Nagasawa, et al., "Nb Multilayer Planarization Technology for a Subnanosecond Josephson 1K-bit Ram", IEEE Transactions on Magnetics, vol. 25, No. 2, Mar. 1989, pp. 777 et seq.
Jaycox, et al., "Planar Coupling Scheme for Ultra Low Noise DC SQUIDS", IEEE Transactions on Magnetics, vol. MAG-17, No. 1, Jan., 1981, pp. 400 et seq.
Rogers, et al., "Fabrication of Heteroepitaxial YBa2-Cu3O7-x-PrBa2Cu3O7-x-YBa2Cu3O7-x Josephson Devices Grown by Laser Deposition", Appl. Phys. Lett., vol. 55, No. 19, Nov. 6, 1989, pp. 2032 et seq.
Furuyama, et al., "In Situ Fabrication of Reproducible YBCO/Au Planar Tunnel Junctions with an Artificial Mgo Barrier", Japanese Journal of Applied Physics, vol. 29, No. 3, Mar. 1990, pp. L459 et seq.
Iguchi, et al., "Tunneling Characteristics of YBaCuO/MgO/Pb Planar Tunnel Junctions and Observation of Josephson Effect", Japanese Journal of Applied Physics, vol. 29, No. 4, Apr., 1990, pp. L614 et seq.
Iguchi, "Tunneling Characteristics and Josephson Effect of YBaCuO Epitaxial Planar Tunnel Junctions", The Second ISTEC Workshop on Superconductivity, May 28-30, 1990.
Furuyama, et al. "In-Situ Growth of Yba2Cu3O7-x Thin Films by Reactive Co-Evaporation Technique", 2nd Workshop on High-Temperature Superconducting Electron Devices, Jun. 7-9, 1989, pp. 105 et seq.
"High $T_c$ Superconducting Oxide Sandwich Structures and Tunnel Junctions", IBM Technical Disclosure Bulletin, vol. 31, No. 9, Feb. 1989.

*Primary Examiner*—Ngan Ngo
*Attorney, Agent, or Firm*—McCubbrey, Bartels & Ward

[57] ABSTRACT

A microelectronic component comprising a crossover is provided comprising a substrate, a first high $T_c$ superconductor thin film, a second insulating thin film comprising $SrTiO_3$; and a third high $T_c$ superconducting film which has strips which crossover one or more areas of the first superconductor film. An in situ method for depositing all three films on a substrate is provided which does not require annealing steps and which can be opened to the atmosphere between depositions.

13 Claims, 8 Drawing Sheets

MICROELECTRONIC SUPERCONDUCTING CROSSOVER AND COIL

This application contains subject matter supported by the U.S. Government and Contract No. DE-AC03-76SF00098, through the U.S. Department of Energy. The government has certain rights in this invention.

This application is a continuation of application Ser. No. 543,462, filed Jun. 25, 1990, now abandoned, which is a continuation in part of application Ser. No. 491,703, filed Mar. 12, 1990, now abandoned, which is a continuation in part of application Ser. No. 491,228, filed Mar. 9, 1990, now abandoned.

This invention relates to electrical structures comprised of high critical temperature ($T_c$) superconductor materials. More particularly, the invention relates to an improved microelectronic superconductor crossover and coil wherein the superconductor material has a high critical temperature. The invention also comprises an improved method for making such crossover and coil structures.

Superconductor materials have been developed which have a high critical temperature ($T_c$), exhibiting superconductivity at temperatures up to and above the boiling point of liquid nitrogen, 77K. The ability to manufacture microelectronic devices employing high $T_c$ superconducting material promises many advantages. Such devices exhibit the advantages of devices employing low temperature superconducting material, but because they can operate in liquid $N_2$, they can be cooled much more easily and less expensively.

Unfortunately, the fabrication of microelectronic structures using high $T_c$ superconductive materials is not a trivial task, and cannot readily follow prior art techniques. For example, low $T_c$ superconductive materials, such as niobium and niobium nitride, may be fabricated using conventional techniques such as vacuum deposition or sputtering, followed by reactive ion etching or similar photolithographic techniques. Examples of microelectronic structures using low temperature superconductive materials are described by Klepner in IEEE Transactions on Magnetics, Jan., 1981, pp. 282 et.seq., by Jaycox, et al. in the same publication at pp. 400 et. seq., by Nagasawa, et al. in IEEE Transactions on Magnetics, Mar. 1989, pp. 777 et. seq., and by Kaplunenko, et al. in the same publication at pp. 861, et seq.

Such common fabrication techniques are not readily suited to many types of multilayer microelectronic devices employing high $T_c$ superconductive materials. The reasons for this involve the fact that, in order to be superconductive, high $T_c$ materials must have epitaxy. Epitaxy may be achieved using an annealing step at a high temperature, for example, 850° C., after the material is deposited. However, thin films of high $T_c$ superconductive materials have a high concentration of defects and, at such annealing temperatures, will interdiffuse rapidly with adjacent layers. Since many microelectronic structures require multiple layers, an annealing step is not practical. Thus, a deposition technique which results directly in formation of multiple heteroepitaxial layers is needed for the construction of such structures.

High $T_c$ superconductive material may be deposited as epitaxial thin films on suitable substrates at temperatures between 650° and 750° C. using laser deposition. In single layer microelectronic structures, a properly prepared substrate surface will result in epitaxial thin films under suitable deposition conditions. However, where an insulating layer is required, such as in the case where conductors cross each other (crossover), the ability to achieve proper insulation and at the same time a surface suitable for the deposition of a third epitaxial thin film layer has not been achieved by the prior art. Multilayer structures of high $T_c$ superconductive material have been reported by Rogers, et al. in Appl. Phys. Lett., Vol. 55, No. 19, Nov. 6, 1989, pp. 2032 et seq., connection with tri-layer junctions that exhibit Josephson Characteristics (electron tunneling). Such tri-layer structures are not suitable as cross-overs, however, since the intermediate layer, ($PrBa_2Cu_3O_x$) has insufficient insulating properties for typical microelectronic crossover applications.

It is an object of the present invention to provide a multilayer microelectronic device wherein two layers of high $T_c$ superconductive materials are separated by an insulating layer.

It is a more general object of the invention to provide an improved microelectronic device.

Another object of the invention is to provide an improved method for manufacturing a microelectronic device employing high $T_c$ superconductive material.

A further object of the invention is to provide a crossover of high $T_c$ superconducting metal oxides (ceramics) in the form of superconductive ceramic coating a substrate, covered by an insulating coating, then covered by a second superconductive ceramic coating so that the two superconductive coatings are electrically insulated from each other.

It is another object of the present invention to provide a method for making microelectronic superconductive crossovers for electronic devices.

It is yet another object of the invention to provide a thin-film multi-turn coil comprising films of superconducting material and insulating material.

These and other objects will be apparent from the following description, accompanying drawings, and from the practice of the invention.

SUMMARY OF THE INVENTION

The present invention provides a superconducting microelectronic component comprising a crossover which is made from a substrate, a first superconductor thin film of high $T_c$ superconductor metal oxide; a second insulating thin film covering at least a portion of the first thin film; and a third superconductor thin film of high $T_c$ superconductor metal oxide over the second thin film. In the preferred embodiment, the first superconductor thin film on the substrate comprises one or more superconductor strips. The second thin film is an insulating film which partially or completely covers this strip. The third film comprises one or more superconductor strips upon the insulator film and crossing over at least one of the strips of the first film.

A method is also provided for preparing such devices in which there is no annealing step required for preparing the superconductor metal oxides and in which each film can be deposited entirely in situ, and whereby the device may be exposed to the atmosphere between deposition steps, if necessary.

DESCRIPTION OF THE PREFERRED EMBODIMENT

Methods are known in the art for the deposition of single layers of thin films of the class of high temperature superconductors know as ceramic oxides or metal oxides, of which the most well known is $YBa_2Cu_3O_x$ ($x$ is a positive number up to 7.0), also known as YBCO and sometimes referred to as 123 mixed metal oxide, based on the stoichiometric proportions of yttrium, barium and copper. However, to produce microelectronic circuits of any complexity, there is a need to develop techniques for depositing multilayer structures.

One important multilayer structure is an insulated crossover, which allows two thin film superconductors to overlap or to cross while maintaining electrical isolation. Virtually all electronic circuits of any complexity require such insulated crossovers. For example, one such utilization of a crossover is in the construction of a thin-film multi-turn superconductor coil. The crossover problem is encountered in making an electrical contact to the inner turn of the coil.

In addition to the electrical considerations, there are the additional problems associated with making a crossover structure using high $T_c$ superconductor thin films. Most thin films have a high concentration of defects and thus interdiffusion proceeds much more rapidly than in a single crystal. If the as-deposited film is not expitaxial, an annealing step is typically required to achieve the desired superconducting characteristics. For YBCO, the annealing temperature is typically about 850° C. However, at a temperature of 850° C., interdiffusion is so fast that a tri-layer structure which requires such a post-annealing temperature is probably impractical to fabricate. Therefore, to fabricate a tri-layer structure comprising mixed metal superconductor, one needs to devise an in situ deposition process which is compatible with relatively low substrate temperature, short deposition time and a way to avoid high temperature annealing.

The present invention is based, in part, on our discovery that to grow high $T_c$ ceramic oxide films for crossovers one must use an insulating layer which has low interdiffusion and chemical reactivity with the substrate and with the ceramic oxide at the deposition temperatures of the ceramic oxide, which can be as high as 750° C. for YBCO. Also, under the deposition conditions, the insulating layer must be able to grow expitaxially or in a highly oriented manner both on the substrate and on the ceramic oxide, as well as to have good coverage of and adhesion to the ceramic oxide and the substrate, particularly at edges and over irregularities. It is also important that the insulating layer has a high resistivity ($\rho$) and provides sufficient insulation between the upper and lower superconducting layers at temperatures below the transition temperature ($T_c$) of the ceramic oxide which is utilized in the device.

Accordingly, the present invention is directed to a process for making microelectronic devices wherein crossovers of superconductor metal oxides can be made and wherein the entire microelectronic device can be made without destroying the electrical properties of the materials which have already been deposited and which are to be deposited.

The thin films are deposited according to the present invention using a laser to ablate the targets, which are, preferably, stoichiometric YBCO, YSZ, or $SrTiO_3$. The deposition can be done in a vacuum deposition chamber with the laser focused onto the target and with a substrate holder which can heat the substrate to the desired temperature. The substrate may be any suitable material, of which many are known to those skilled in the art, such as MgO, $SrTiO_3$, YSZ, and $LaAlO_3$.

The substrate heater is first outgassed and the substrate temperature is raised to the range of about 650° to 750° C. (for deposition, for example, of YBCO) while the deposition chamber is evacuated to about 5 $\mu$Torr. A preferred temperature for heating the substrate is about 730° C. for YBCO. Oxygen is then bled into the system, since it is required to maintain proper stoichiometry in the deposited film. Typically, oxygen pressure within the vacuum chamber of about 150 to 250 mTorr, preferably about 190 mTorr, is useful for YBCO deposition. The substrate may be covered by a mask defining in its open areas the pattern for the first layer. A typical mask may comprise a patterned stainless steel foil, silicon wafer, or other durable material which will withstand the temperatures and conditions in the deposition chamber. Alternatively, photolithography or another suitable process may be used to configure the desired pattern after the deposition is completed.

Typically, prior to deposition, the target surface is cleaned with laser pulses and then the high $T_c$ ceramic oxide, such as YBCO, is deposited by focusing the laser on a stoichiometric YBCO target formed by pressing and sintering calcined powder into disks. Preferably, the first layer is deposited to a thickness of about 0.1 to 0.6 $\mu$m (for YBCO layers); however the thickness may be varied depending on the final application and desired current carrying capacity of the microelectronic device. A thickness in the range of 0.2-0.4 $\mu$m is most preferred. After deposition, the chamber is filled with oxygen to atmospheric pressure and the substrate block allowed to cool to about 450° C.

After further cooling of the substrate to a handleable temperature (about 100° C. or less), the chamber may be opened to remove the mask and to replace it with a suitable mask for depositing the second (insulating)

layer, and to replace the target with the insulator target material. It is a significant advantage of the present invention that the chamber may be opened and the substrate and deposited ceramic oxide layer exposed to the atmosphere for further processing.

After the mask for the insulator layer deposition has been positioned the chamber is then closed and evacuated while the substrate is outgassed at about 200° C. This low temperature minimizes the loss of oxygen from the ceramic oxide layer. After the pressure within the chamber is lowered, preferably to about 5 $\mu$Torr, the substrate temperature is rapidly raised to a suitable temperature for deposition of the insulator, (about 680° C. for $SrTiO_3$ deposition) and oxygen is bled in to obtain about 190 mTorr pressure. The target is cleaned with the laser, and $SrTiO_3$, yttrium stabilized zirconia (YSZ), or other suitable insulator, is deposited, preferably, for a period sufficient to form a 0.1 to 0.5 $\mu$m thick layer or such that it is sufficiently insulating. It is useful to use the same cooling procedure as in the first deposition.

After cooling of the substrate, the chamber may again be opened and the mask removed and target changed for the next deposition. Outgassing and deposition may be accomplished as in the first deposition step. The third layer may usefully be deposited to a thickness of about 0.1 to 0.5 $\mu$m, if the layer is, for example, YBCO. The third layer may be patterned by using a mask or by photolithography followed by an ion mill etch.

Figure 1A:
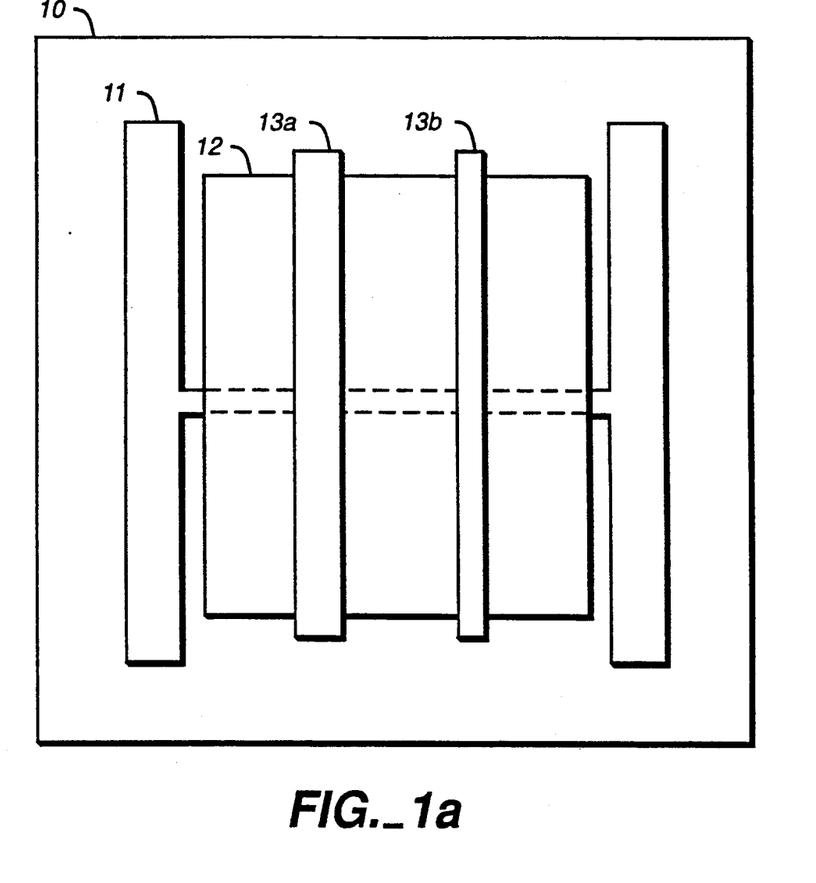
FIGS. 1A and 1B are, respectively, a plan and side view of an example of a high $T_c$ microelectronic crossover element constructed according to the present invention.

Referring to FIG. 1 there is shown a microelectronic device having a high $T_c$ superconductor crossover in accordance with the present invention. Referring to FIG. 1A, a substrate 10 which is receptive to YBCO and $SrTiO_3$ is utilized. The preferred substrate is MgO having a polished surface. The first layer 11 comprises a metal oxide superconductor deposited in an H pattern where the cross bar of the H forms a narrow strip. The second layer 12 is insulating $SrTiO_3$ which, as shown, only partially covers the first layer and specifically only covers the portion of the cross bar of layer 11 where the crossover will occur. The third layer 13 comprises YBCO in the form of two strips 13A, 13B deposited over the insulating layer 12.

Figure 1B:
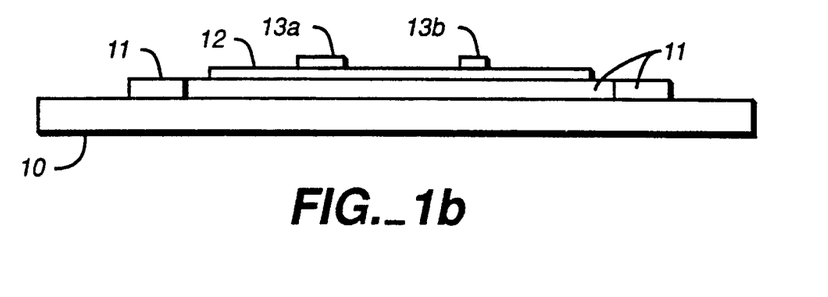

Referring to FIG. 1B, there is shown a side view of the device shown in 1A wherein the numerals 10, 11, 12, 13A and 13B are as described above.

Figure 2:
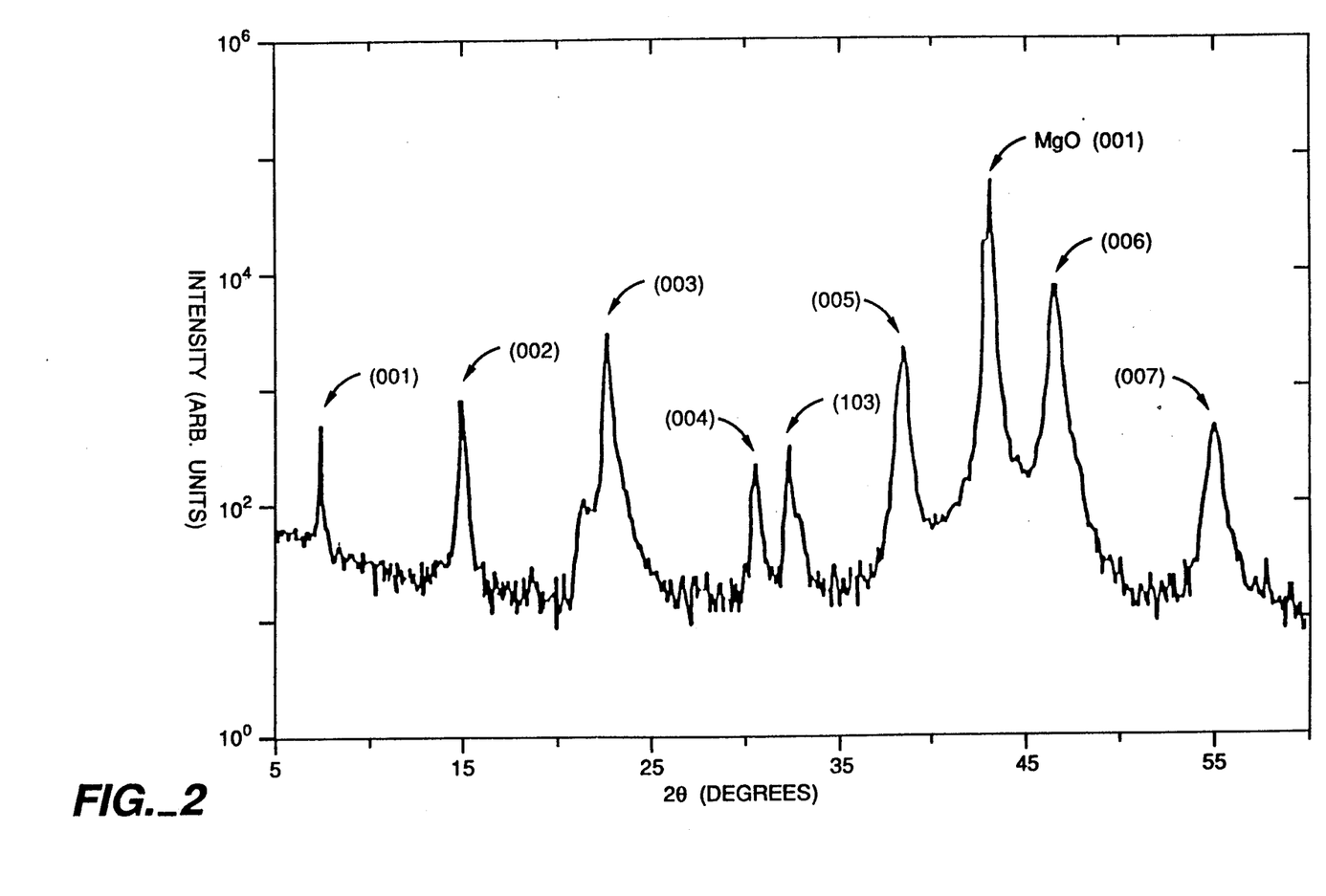
FIG. 2 is an X-ray diffraction spectrum for the crossover device shown in FIGS. 1A and 1B.
Figure 3A:
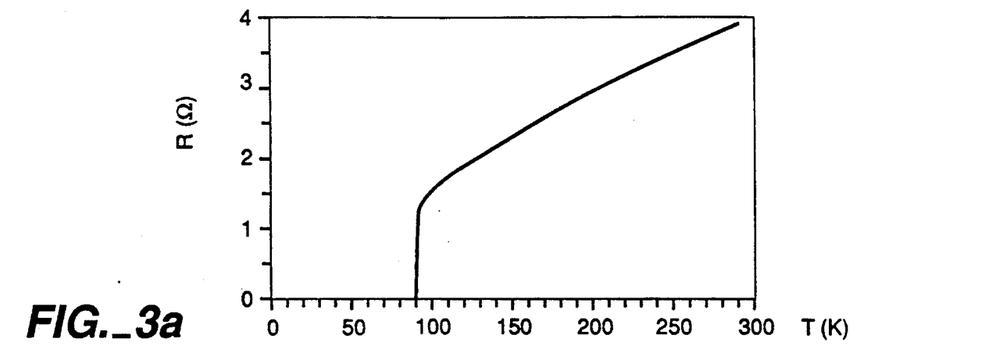
FIGS. 3A-D are plots of resistance (R) versus temperature (T) for a single layer of YBCO deposited on an MgO substrate (FIG. 3A); for the lower YBCO film of the device in FIG. 1 (FIG. 3B); for the upper YBCO film of the device in FIG. 1 (FIG. 3C); and for the insulating $SrTiO_3$ measured between the YBCO film layer in the device shown in FIG. 1 (FIG. 3D).
Figure 3B:
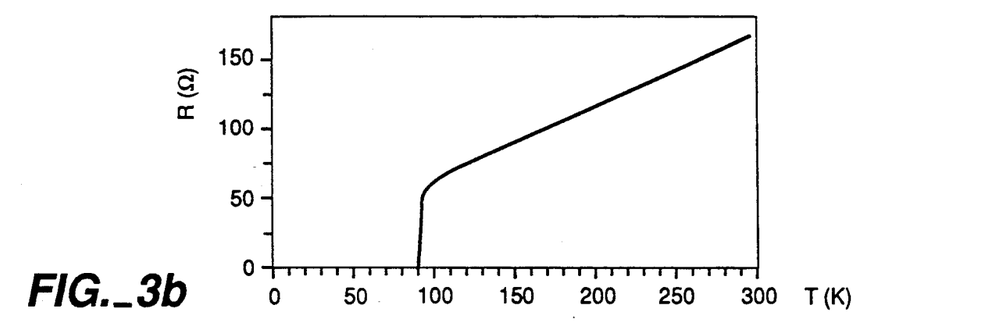
Figure 3C:
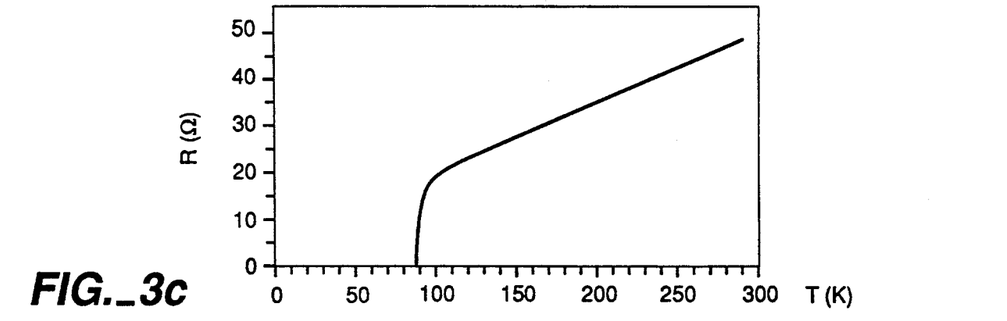
Figure 3D:
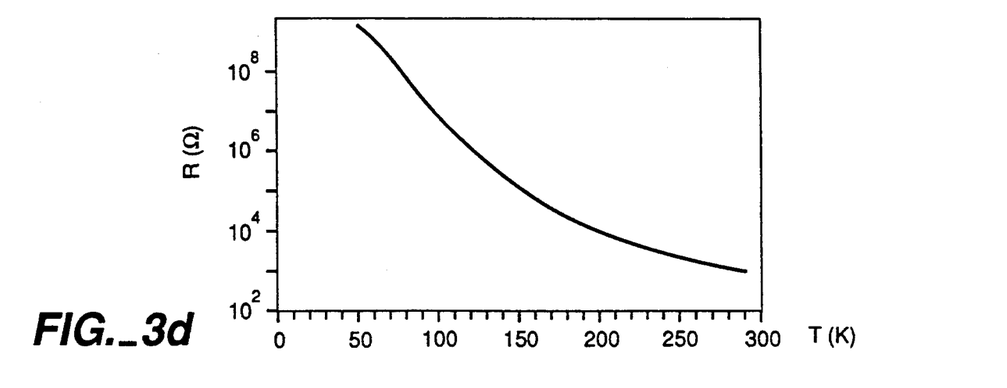

Referring to FIG. 2, there is shown an X-ray diffraction spectrum of a tri-layer device having a configuration as shown in FIG. 1 and made according to the description in the following example. The spectrum in FIG. 2 indicates that the YBCO is predominantly c-axis (the axis through the thickness of the film) oriented. There is an impurity phase peak located at $2\Theta = 32.39°$ which may be due to some contributions from YBCO (103) and (110) and $SrTiO_3$ (110). It appears that both YBCO and $SrTiO_3$ have some random orientation. It is important that the coverage of the insulation material be substantially uniform and without pinholes or other voids which could cause a short between the superconducting layers. Laser deposition has been found to be an effective process for accomplishing this. However, other processes such as electron beam vacuum deposition, and sputtering, may be utilized under appropriate circumstances to achieve such coatings.

Figure 4:
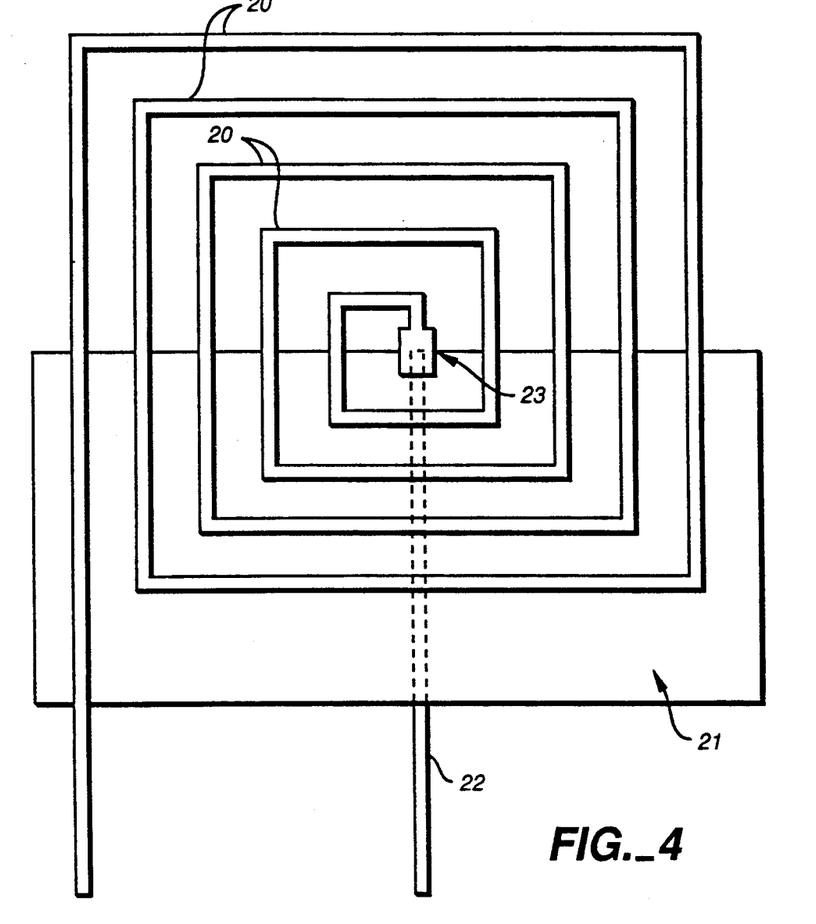
FIG. 4 is a plan view of an example of a thin-film multi-turn coil according to the present invention.

Referring to FIG. 4 there is shown a thin-film coil in accordance with the present invention. The coil comprises a series of square loops 20 made from a thin film of a high-$T_c$ superconducting material. For purposes of illustration, an insulating layer 21 is shown, which insulates the single conducting strip 22, which is located below insulator layer 21, from the strips comprising the loops 20 which are above the insulating layer 21. The superconducting electrical contact between the lower strip 22 and the upper layer comprising loops 20 occurs at contacting area 23 which may be formed by, for example, leaving a portion of the lower strip 22 unprotected by the insulator layer 21 and then depositing a film of the superconductor material thereover, thereby joining the lower strip 22 with the upper layers.

Figure 5:
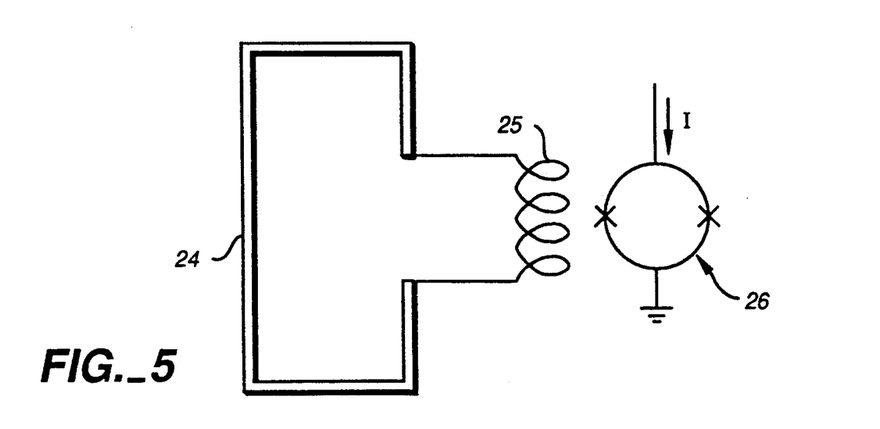
FIG. 5 is a schematic view of an example of a thin film flux transformer according to the present invention, coupled to a d.c. SQUID.

Referring to FIG. 5, there is shown a schematic of a superconducting quantum interference device (SQUID) utilizing a flux transformer according to the present invention. A pick-up coil 24 is made having a loop defining a relatively large area which may thus act as a sensor for, for example, applied magnetic fields. The input coil 25 may be a thin film coil made, for example, as that shown in FIG. 4. The input coil 25, relative to the pick-up coil 24, is a small multiturn coil, preferably approximately the same size as a DC SQUID 26. SQUID 26 may be a device fabricated from either low transition temperature or high transition temperature superconductors which convert a flux signal from the input coil 25 into a voltage which can then be detected with conventional electronics. The flux transformer comprising the two superconducting coils 24 and 25 may increase the sensitivity of the SQUID to applied magnetic fields, as compared to the sensitivity if the flux transformer were absent. Alternatively, the pick-up coil 24 may be of a multiloop design which may be sensitive, for example, to gradients in a field, thereby being useful, for example, for discriminating among local sources of the fields.

A flux transformer such as that shown in FIG. 5 comprising coils 24 and 25 made of a high-$T_c$ material may therefore not only enhance the sensitivity of a SQUID to applied magnetic fields, but may also make it sensitive to derivatives of the field and allow suppression of noise from distant sources.

It is believed that it is a significant improvement of a high-$T_c$ SQUID to be coupled to a flux transformer as described above because of an enhancement of the magnetic field sensitivity which is low in SQUIDs having a small pick-up area for magnetic field. For a typical high-$T_c$ flux transformer, it is preferred that the line widths of the patterned high-$T_c$ strips be of the order of or less than about 20 micrometers in width. The superconducting ceramic oxide material forming the coil should preferably sustain a measurable critical current and most preferably a current of at least about 10 microamps at a relatively high temperature preferably above 77° K.

Figure 6:
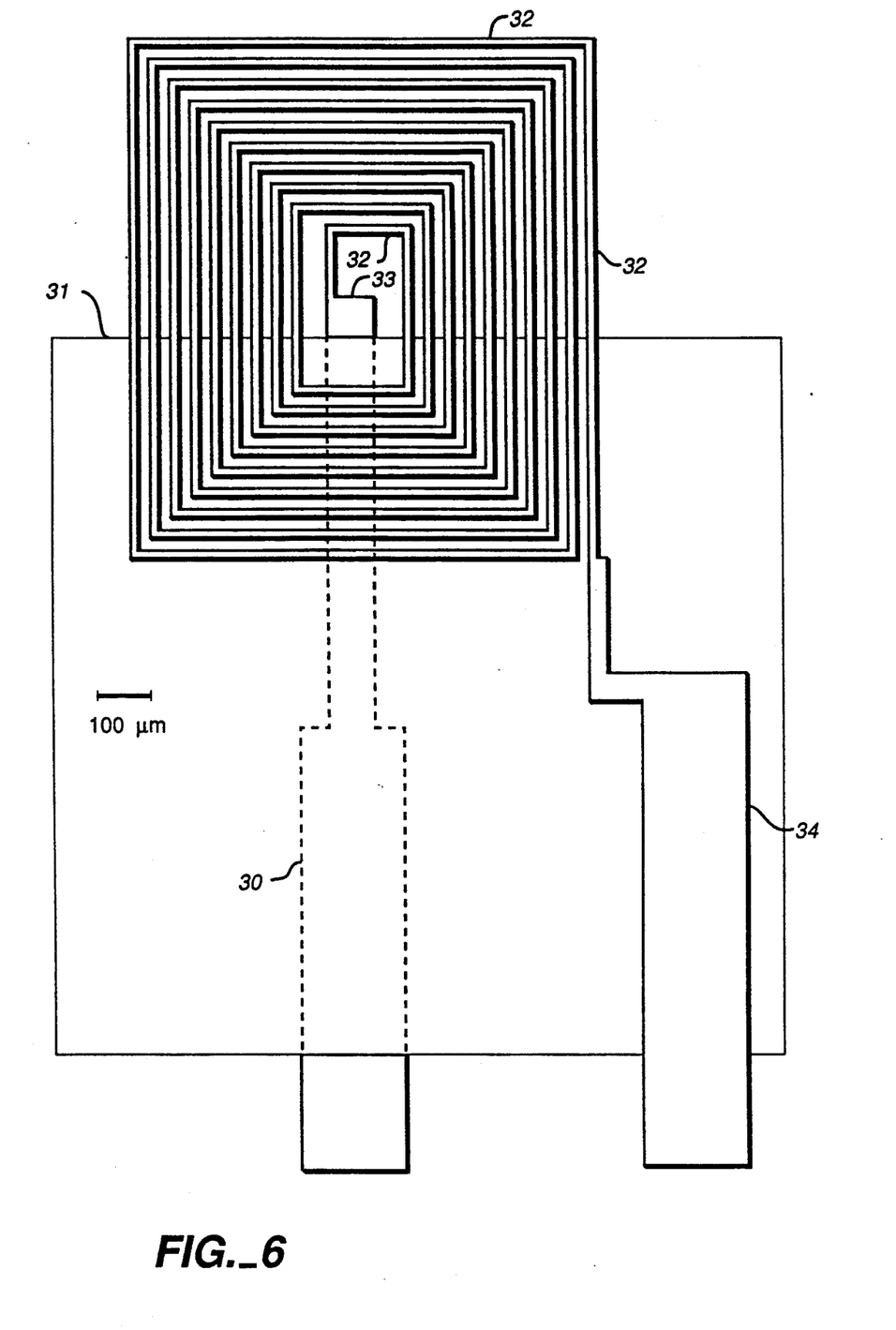
FIG. 6 is a plan view of another example of a thin film multi-turn coil according to the present invention.

Referring to FIG. 6, there is shown another design of a thin-film coil which illustrates that the number of coil turns, the sizes and linewidths may be altered simply by altering the shapes of the photolithographic masks. In the particular design shown in FIG. 6, the strip 30 is under the insulator layer 31. The ten coil turns 32 (nominally 20 $\mu$m linewidth for 10 turns, or 10 $\mu$m for 19 turns) above insulator 31 are electrically connected to strip 30 at contact point 33. A particular coil on which measurements were taken had an outside dimension of 1 mm and an inside dimension of about 150 $\mu$m. The upper layer of superconducting material terminates as a strip 34 which may be used to form electrical connections to other components.

The following examples are provided by way of illustration and are not intended to limit the invention in any way.

EXAMPLE 1

A $12.5 \times 12.5 \times 1$ mm$^3$ cleaved and polished (100) MgO substrate was cleaned successively in an ultrasonic bath with xylene, trichlorethylene, isopropyl alcohol and ethanol, rinsed with methanol, and blown dry with N$_2$. The superconductor films are deposited from stoichiometric YBCO targets pressed and sintered from calcined powder into disks 25 mm in diameter and 3 mm thick. The insulating layer is deposited from SrTiO$_3$ powder pressed into a disk of the same size. Before each deposition, the surface of the targets are ground with #400 emery paper, polished on a latex sheet and blown with N$_2$. Each layer is deposited in turn using the 248 nm pulses (18 ns full width at half maximum) from a Questek 2820 excimer laser in a diffusion-pumped vacuum system. A $5.4 \times 14$ mm$^2$ aperture selects the uniform portion of the beam, which is focused by a 0.15 m focal length lens onto the target at an angle of incidence of 45°. The target is glued to one end of a copper cylinder that rotates at about 60 rpm; the bearings for the shaft are mounted in a water-cooled block. The substrate is clamped to a heater block which is coated with a layer of silver paste to insure good thermal contact. This block is resistively heated, and its temperature is monitored by an embedded Chromel-Alumel thermocouple. The substrate is 60 mm from the target, and aligned to intercept the central portion of the plume emanating from the target. A water-cooled plate partially shields the target from the thermal radiation emitted by the substrate heater block to prevent melting of the surface of the target.

The first step in the process is to outgas the heater and substrate by increasing the temperature to 740° C. as the chamber is evacuated to 5 μTorr. Then, the temperature is held constant while the gate valve is throttled and O$_2$ is bled in to maintain a pressure of 190 mTorr. The surface of the substrate is covered with a shutter and the target is cleaned with 300 laser pulses at a rate of 5 per second with an energy density of 1.3 Jcm$^{-2}$. The first layer of YBCO is deposited for 10 minutes, at the same repetition rate and fluence, to a thickness of about 0.4 μm. The mask allows for the layer to be patterned into strips which will form conductive paths for the circuitry. The strips preferably have widths in the range of 0.2-10 mm. The chamber is then back-filled with O$_2$ to 1 atmosphere and the heater power is reduced to allow the block to cool to 450° C.

In 15 minutes the sample is allowed to cool to 100° C. or less. In preparation for the insulating layer, the chamber is opened and the masks are exchanged. The YBCO target is replaced with a polished SrTiO$_3$ target. As the chamber is evacuated to 5 μTorr, the heater block is outgassed at the relatively low temperature of 200° C. to minimize the loss of oxygen from the YBCO layer. The block temperature is then rapidly raised to 680° C., O$_2$ is bled in to 190 mTorr, and the target is cleaned as described above. After opening the shutter, SrTiO$_3$ is deposited for 7 minutes at 5 pulses per second at an energy density of 1.3 Jcm$^{-2}$, to produce a film that varies in thickness from 0.4-0.45 μm. The same cooling procedure is used.

After changing masks and inserting a polished YBCO target, the substrate is outgassed at 200° C. until the pressure falls to 5 μTorr. The temperature is raised to 740° C., O$_2$ is bled in to 190 mTorr, the target is cleaned for 1 minute, and a third layer is deposited approximately 0.4 μm thick. The mask allows the third layer to be patterned into strips. Preferably, the width of the strips is 0.2 mm-10 mm. After the usual cooling procedure, the sample is removed for testing.

To reduce the particle density on the deposited YBCO film to typically 1 per 2500 μm$^2$, it is preferred that the YBCO target face be polished before deposition, and that the laser pulse power/unit area be lowered to close to the minimum necessary to yield high quality films. A further reduction of particle density can be achieved by increasing the area of the target that is ablated by the laser, and/or by polishing the target face during deposition. The elimination, or at least the minimization of the density of 1 μm particles on the deposited film may be desirable in multilayer structures such as an insulated crossover, and is particularly important in a structure with a thin insulating layer such as a tunnel junction. The electrical properties of the three-layer component were measured using a 4-terminal arrangement, making contacts to the films with pressed Indium pellets.

FIG. 3($a$), for comparison, is a representative plot of resistance (R) vs. temperature (T) for a single layer of YBCO deposited on MgO. Zero resistance is at $T_{co} = 87.8$K and the transition width $\Delta T_c$ is 2K (10% to 90%). The critical current densities of the patterned single-layer film are typically $J_c = 10^6$ A cm$^{-2}$ at 77K. FIGS. 3($b$) and 3($c$) show R vs. T for the lower and upper YBCO film in the crossover device: $T_{co} = 87.3$K and 87.7K and $\Delta T_c = 1$K and 3K, respectively. The resistance of the SrTiO$_3$, measured between the lower and upper YBCO strips, increases as the temperature is lowered [see FIG. 3($d$)]. AT 77K, the resistance is approximately 100MΩ, corresponding to $\rho = 4 \times 10^9$ Ωcm. The resistivity of high quality SrTiO$_3$ at room temperature is typically $10^9$ Ωcm, whereas this film yields $\rho = 4 \times 10^4$ Ωcm, suggesting the presence of impurities or film defects.

The fact that the microelectronic device can be exposed to air between each deposition is an enormous advantage in the fabrication of complex circuits in that it allows one to pattern each layer using masks or photolighography and etching.

EXAMPLE 2

Two kinds of masks can be used for patterning the first two layers of a coil shown in FIG. 6, etched Si chips, and electrically machined stainless steel foil. Patterns were cut in 50 μm or 100 μm stainless steel foil using an EDM spark cutting machine with thin Cu electrodes. The Si masks were formed four at a time on 5 cm diameter 275-350 μm thick Si wafers which were coated with Si$_3$N$_4$, patterned with photoresist and etched with an SF$_6$ and O$_2$ plasma, and then etched in KOH. The first layer mask defines the YBCO crossunder, and is a long 100 μm wide line, which stretches from almost one end of the MgO substrate to the other. The second layer mask is a large rectangular window in an otherwise solid mask. The insulating SrTiO$_3$ layer is deposited through this mask to cover the central portion of the crossunder, with the ends of the crossunder remaining uncovered. The patterns for the first two layers were designed to be almost self-aligning, so that very little precision is needed in the positioning of the masks.

The top YBCO layer is then deposited without any mask, so as to completely cover over the first two layers. The final patterning step is then accomplished with an Ar ion mill using photoresist as a stencil mask. This final patterning step defines the turns of the input coil, forms the pickup coil or pads, and also chops off the end of the first layer of YBCO where it runs through the center of the coil and would otherwise short the turns. The mill must be stopped from etching through the crossunder by the overlying layer of $SrTiO_3$.

The depositions are carried out in a high vacuum chamber with an oil-based diffusion pump and a liquid nitrogen cold trap. The films are deposited onto (100) cleaved and polished $12.5 \times 12.5 \times 1$ mm$^3$ substrates, which are substantially free of pits and scratches, using in situ laser deposition techniques. A Questek series 2820 KrF Excimer laser with a wavelength of 248 nm is apertured and focused onto a 25.4 mm diameter pressed target using a single 15 cm focal length lens. The target is mounted on a large cooled Cu block, partially shielded from thermal radiation from the heater block to prevent target melting, and rotated. The sample is mounted on a heater block about 6 cm away from the target and intercepts the plume of material emitted from the target after the laser pulse strikes it. The temperature of the block is monitored with a Chromel-Alumel thermocouple and an infrared pyrometer.

The chips are first cleaned in an ultrasonic bath sequentially with trichloroethylene, isopropyl alcohol, and methanol, after which they are blown dry with compressed $N_2$ gas. The front face of the substrate heater block is then coated with silver paste to ensure good thermal contact, and the substrate and first layer mask are clamped into place. A YBCO target is then mounted on the rotary holder and the high vacuum chamber is evacuated. The silver paste and heater block are outgassed at 740° C. until the pressure in the chamber falls to $5 \times 10^{-6}$ Torr. Then 45 mTorr of $O_2$ is bled through the chamber and the surface of the target is cleaned with 135 mJ pulses at a repetition rate of 5 Hz for 1 minute. A 50 W rf oxygen plasma is struck in the chamber, the shutter is opened, which had been blocking the sample surface, and YBCO is deposited using 1.3 J/cm$^2$ pulses at 5 Hz for 6 minutes. This results in a film approximately 400 nm thick. This plasma assisted laser deposition produces very sharp line definition with the mechanical masks, and the plasma is necessary to ensure sufficient oxygen incorporation into the film and thus maintain a high transition temperature (Tc).

The chamber is then quickly filled with 700 Torr of $O_2$ and the heater block allowed to cool to 450° C. in 15 min, after which time the heater is allowed to cool to room temperature in another 15 minutes. After cooling, the sample is removed from the chamber, the first layer mask is removed, the second layer mask is clamped into place, and the YBCO target is exchanged for a smoothed and polished $SrTiO_3$ target. The chamber is then reevacuated to $5 \times 10^{-6}$ Torr while the heater is held at approximately 200° C. The heater block temperature is then rapidly increased to 680° C., the chamber is filled with 200 mTorr of $O_2$, and the surface of the $SrTiO_3$ is cleaned with 300 laser pulses at 1.3 Jcm$^{-2}$. The shutter is then opened, and $SrTiO_3$ deposited using 1.3 Jcm$^{-2}$ pulses at 5 Hz for 6 min. This results in the deposition of a film approximately 400 nm thick. The heater is then cooled in $O_2$ as in the previous step.

After cooling, the second layer mask is removed, and the $SrTiO_3$ target is exchanged for a smoothed and polished YBCO target. The chamber is again evacuated to $5 \times 10^{-6}$ Torr while the heater block is raised to 200° C. The temperature is then rapidly increased to 730° C., 200 mTorr of $O_2$ is bled through the chamber and the surface of the target is cleaned with 300 laser pulses at 1.3 Jcm$^{-2}$. The shutter is then opened, and YBCO deposited using 1.3 Jcm$^{-2}$ pulses at 5 Hz for 6 min, again producing a film approximately 400 nm thick. The sample is then allowed to cool as before in $O_2$.

Figure 7:
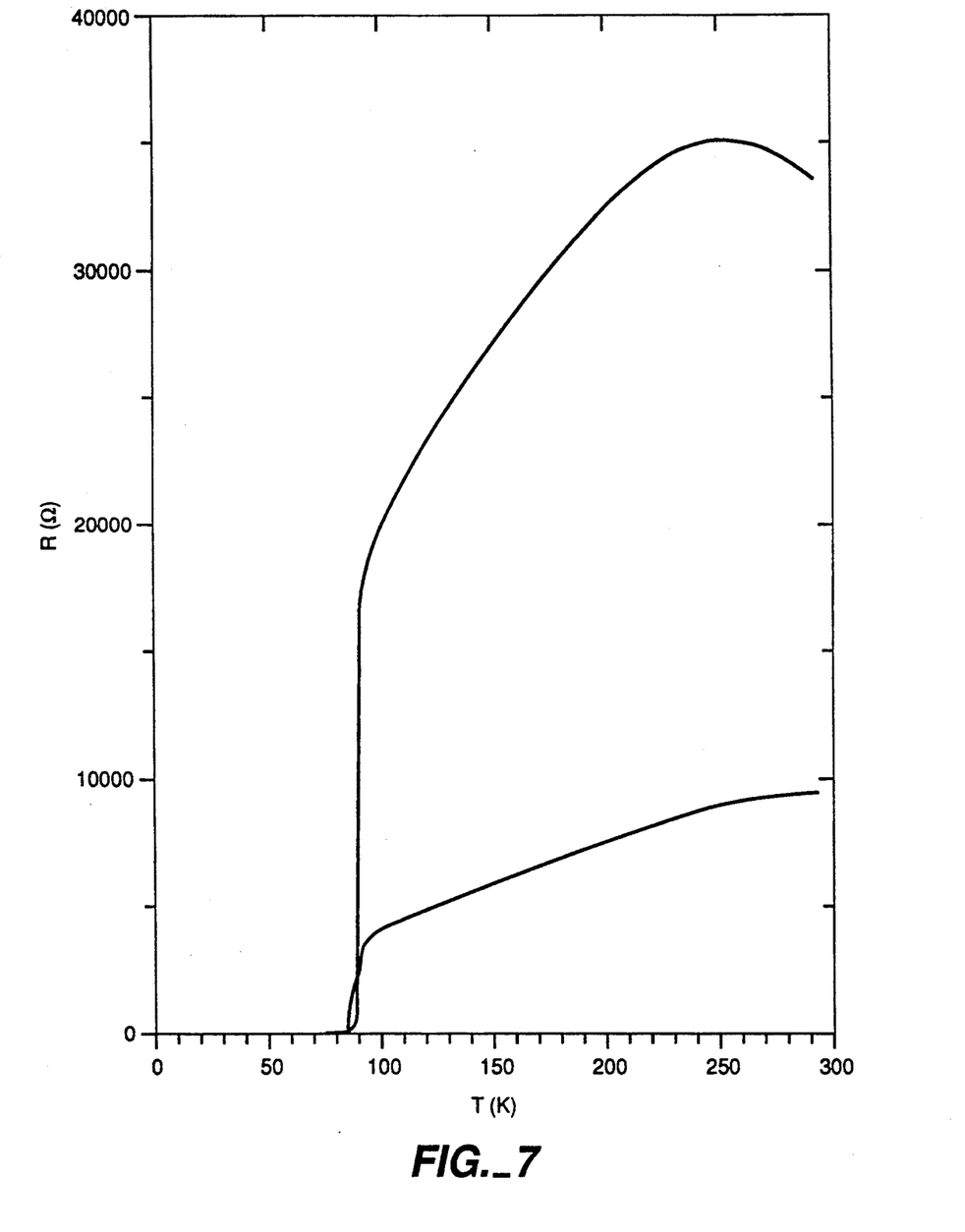
FIG. 7 is a graph of resistance vs. temperature for 10-turn and 19-turn thin-film coils constructed according to the present invention.

After cooling, the chip is detached from the heater block. Shipley Microposit 1400-31 photoresist is spun at 2000 RPM for 30 seconds, and then baked at 70° C. for 5-7 min. This produces a 2-3 $\mu$m thick layer of resist. This relatively thick layer is necessary to withstand the long subsequent ion mill etch. The pattern for the coil and pads is then exposed, and the resist developed in microposit developer for approximately 60 seconds. The back of the chip is then coated with vacuum grease and clamped onto a large Cu block heat sink, and etched for a total of approximately 25 to 40 min in a 450 V to 600 V, 1.5 mA/cm$^2$ beam of Ar ions. To prevent heating damage to the YBCO, the milling is done in intervals of 5 min with approximately 15 min cooling intervals between, and aluminum foil may be used to protect portions of the device that require less etching time. After milling, the photoresist is stripped off in 30 sec in an ultrasonic ethanol bath. For testing individual coils, Indium contacts are pressed onto the pads, and a four point technique is used to measure the resistance, R, and critical current, $I_c$, as a function of temperature T. FIG. 7 shows R vs. T for a 10-turn coil (lower) and a 19-turn coil (upper). Initially, as the temperature is lowered from 300K, the resistance decreases slowly. At lower temperatures, the insulator resistance becomes very large and conduction along the YBCO turns of the coils dominates.

Figure 8:
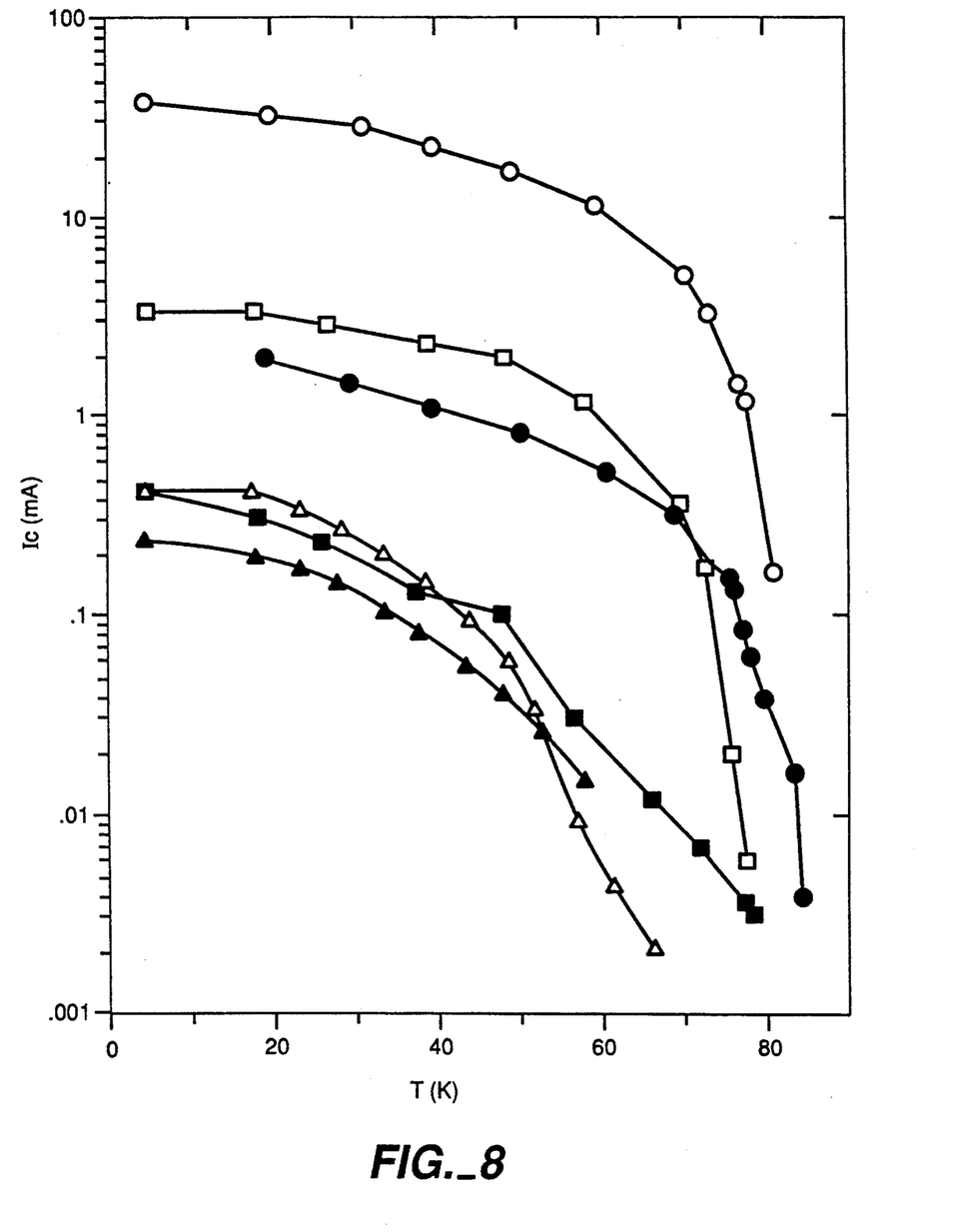
FIG. 8 is a graph of critical current, $I_c$, vs. temperature for six coils made according to the invention.

FIG. 8 shows $I_c$ vs. T for 6 coils. The values at high temperatures are highly variable because of the different transition temperatures of the coils. The two coils having the lowest transition temperatures and critical currents may have suffered from degradation during the milling process; the milling was done in 18 min intervals rather than 5 minute intervals. The two highest critical currents differ by more than an order of magnitude. The remaining two coils were made with top and bottom YBCO layers half as thick as the other coils. The coil having the largest critical current was measured at approximately 50 mA at 4.2K and 1.4 mA at 77K.

Figure 9:
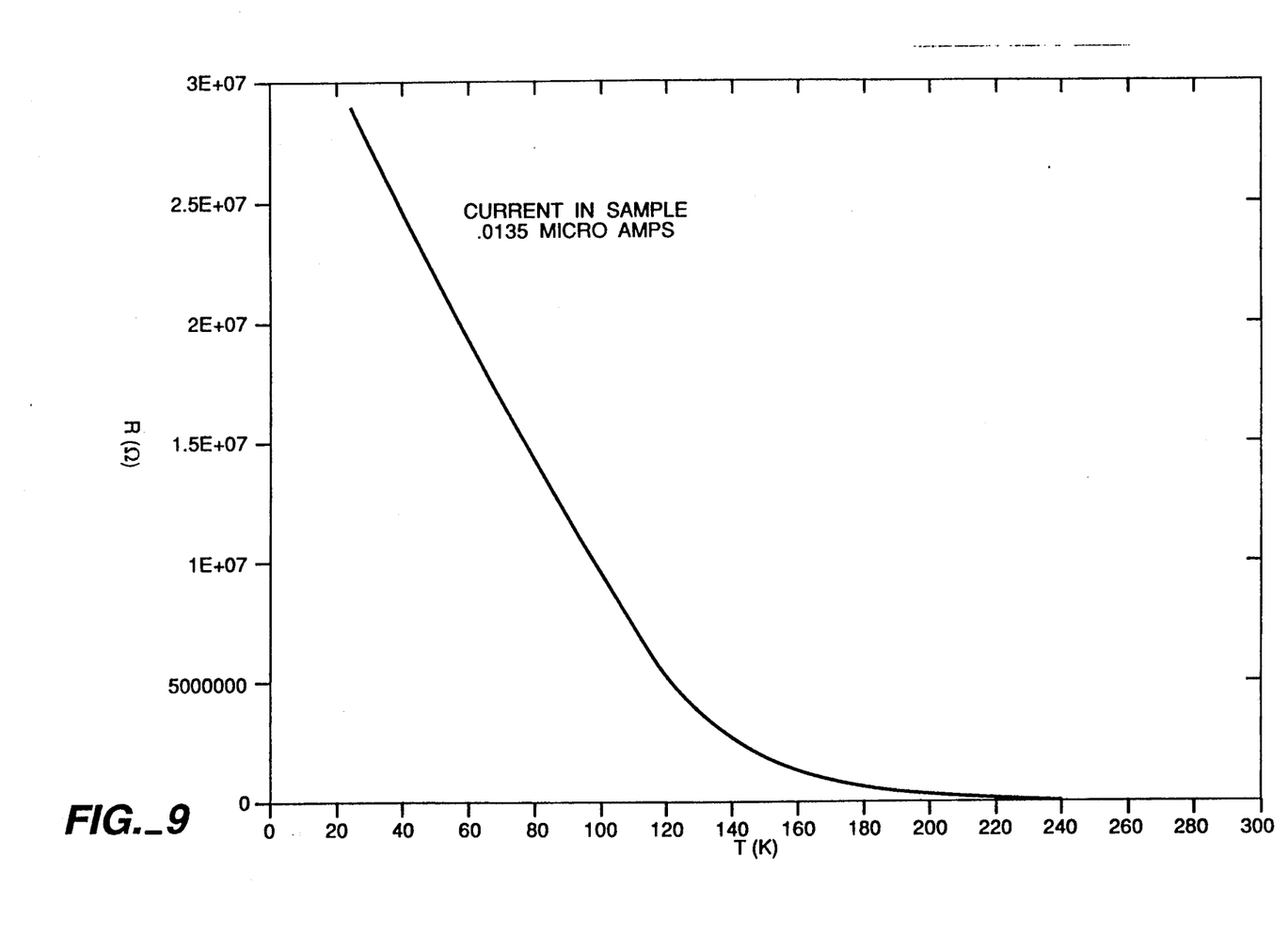
FIG. 9 is a graph of resistance vs. temperature, where the resistance of the insulating layer is incurred between the crossunder and 17 crossovers of a 19-turn coil constructed according to the invention.

FIG. 9 shows the resistance between the crossunder and the turns of the coil for a different device. In order to obtain this plot, it was necessary to break the first turn of the coil. This was done by patterning with photoresist and ion milling through the turn. The resistance steadily increases as the temperature is lowered and becomes greater than 10 M$\Omega$ by 80K. This level of resistance is far in excess of any minimum requirement for flux transformers (values greater than 10 $\Omega$ would produce negligible Nyquist current noise). Measurements on individual crossovers have yielded far higher resistivities, 10$^9$ $\Omega$cm at 290K, consistent with high quality $SrTiO_3$. The lower resistance obtained in this coil may be the result of small defects in the insulation.

The best coil had a critical current greater than 1 mA at 77K, a critical current density of about $5 \times 10^5$ Acm$^{-2}$ at 4.2K, and was superconducting above 80K. We found that two coils on the same chip usually have very similar transition temperatures and R-T characteristics, indicating that the process is relatively repeatable, although the critical current in such coils can differ by an order of magnitude or more, possibly due to the presence of small random defects in the coil which are hardly discernible on the R-T but produce the low critical current density. The properties of the coils make them entirely suitable for use in flux transformers.

EXAMPLE 3

The same procedure may be utilized as in Example 1 except as follows. A stoichiometric pressed powder target of yttrium stabilized zirconium (YSZ) is used instead of the SrTiO$_3$. The first layer of YBCO is deposited as described in Example 1 except during deposition, the heater block is held at 740° C. and the oxygen pressure is maintained at 200 mTorr. The film is deposited for 6 minutes at a laser repetition rate of 4.8 Hz with a laser fluence of 1.3 Jcm$^{-2}$. After deposition the cooling procedure described in Example 1 is followed.

Masks are changed after cooling and the YBCO target is replaced with the YSZ target before the vacuum system is evacuated to about 3×10$^{-6}$ Torr while the temperature of the heater block is raised to about 200° C. The temperature is then quickly raised to 680° C., an oxygen pressure of 100 mTorr established and the YSZ film is deposited for 8 minutes at 14.4 Hz with a laser fluence of 2.25 Jcm$^{-2}$. The same cooling procedure is followed.

After cooling, masks and targets are exchanged and this system is again evacuated to about 3×10$^{-6}$ Torr while the temperature is increased to about 200° C. The temperature is then quickly raised to 740° C., an oxygen pressure of 200 mTorr established, and the upper YBCO film is deposited for 6 minutes at 4.8 Hz with a fluence of 1.3 Jcm$^{-2}$. The usual cooling procedure precedes dismounting the sample from the heater block and testing its electrical properties.

The invention is described in terms of the preferred embodiments. It will be realized that other modifications and variations will be apparent from the above description and for practice of the invention to those skilled in the art. These modifications and variations are intended to be within the scope of the present invention and the invention is not intended to be limited except by the following appended claims.

What is claimed is:

1. A microelectronic device comprising a substrate; a first superconductor thin film layer of high $T_c$ superconductor metal oxide material capable of maintaining superconductivity at the boiling point of liquid nitrogen; a second insulating thin film layer covering at least a portion of said first superconductor thin film layer; said second insulating thin film layer being comprised of a material having high resistivity at temperatures below the $T_c$ of said first thin film, said second insulating thin film layer having a microstructure which is epitaxial or highly oriented sufficient to support epitaxial growth thereon of a third layer within a range of deposition temperatures, the third layer comprising a high $T_c$ superconductive material capable of maintaining superconductivity at the boiling point of liquid nitrogen, said second insulating thin film layer further having interdiffusion and chemical reactivity characteristics in relation to the material of said first superconductor thin film layer sufficient to maintain its insulating characteristics and not to degrade said first superconductor thin film layer when heated to a temperature within the range of deposition temperatures of the third layer, said second insulating thin film layer further having substantial coverage of and adhesion to said first superconductor thin film layer, and said second insulating thin film layer further having a high diffusion rate for oxygen in the range of deposition temperatures of the third layer.

2. A device according to claim 1 wherein said first superconductor thin film layer comprises a mixed metal superconductor oxide of yttrium, barium and copper, and wherein said second insulating thin film layer is selected from the group consisting of SrTiO$_3$ and yttrium stabilized zirconia.

3. A device according to claim 1 wherein said first superconductor thin film layer comprises YBa$_2$Cu$_3$O$_x$.

4. A thin film microelectronic structure comprising a substrate, a first thin film epitaxial layer of a high $T_c$ superconductive material, a second thin film layer on the opposite side of said first thin film epitaxial layer from said substrate, said second thin film layer being comprised of a material having high resistivity at temperatures below the $T_c$ of said first thin film epitaxial layer, and a third thin film epitaxial layer of a high $T_c$ superconductive material formed at a selected deposition temperature on the opposite side of said second thin film layer from said first thin film epitaxial layer, each of the high $T_c$ superconductive materials of said first and third thin film epitaxial layers capable of maintaining superconductivity at the boiling point of liquid nitrogen, said second thin film layer having a microstructure which is epitaxial or highly oriented sufficient to support epitaxial growth thereon of said third thin film epitaxial layer, said second thin film layer further having interdiffusion and chemical reactivity characteristics in relation to the material of said first thin film epitaxial layer sufficient to maintain its insulating characteristics and not to degrade said first thin film epitaxial layer at said selected deposition temperature, said second thin film layer further having substantial coverage of and adhesion to said first thin film epitaxial layer, and said second thin film layer further having a high diffusion rate for oxygen at said selected deposition temperature of said third thin film epitaxial layer.

5. A device according to claim 4 wherein said first thin film epitaxial layer comprises one or more strips and said third film epitaxial layer comprises one or more strips crossing over at least one of said strips of said first film epitaxial layer.

6. A device according to claim 4 including a superconducting contact extending between said first thin film epitaxial layer and said third thin film epitaxial layer.

7. A device according to claim 4 wherein said first thin film epitaxial layer comprises a mixed metal superconductor oxide of yttrium, barium and copper, said second thin film epitaxial layer comprises SrTiO$_3$, and said third thin film epitaxial layer comprises a superconductor mixed metal oxide of yttrium, barium and copper.

8. A device according to claim 5 wherein each strip of said first thin film epitaxial layer has a thickness in the range of 0.1 to 0.6 μm and a width in the range of 0.1 to 10 mm; wherein said second thin film epitaxial layer comprises a thickness in the range of about 0.1 to 0.6 μm; and wherein each strip of said third thin film epitaxial layer comprises a thickness in the range of 0.1 to 0.6 μm and a width in the range of about 3 μm to 10 mm.

9. A device according to claim 4 comprising a multi-turn coil wherein said first thin film epitaxial layer is electrically connected to said third thin film epitaxial layer at predetermined locations.

10. A device according to claim 9 wherein said coil comprises a flux transformer.

11. A device according to claim 4 wherein said first and third thin film epitaxial layers are comprised of $YBa_2Cu_3O_x$.

12. A device according to claim 4 wherein said second thin film layer is comprised of $SrTiO_3$.

13. A device according to claim 4 wherein said second thin film layer is comprised of yttrium stabilized zirconia.

* * * * *